United States Patent [19]

Margalit et al.

[11] Patent Number: 4,636,823
[45] Date of Patent: Jan. 13, 1987

[54] VERTICAL SCHOTTKY BARRIER GATE FIELD-EFFECT TRANSISTOR IN GAAS/GAALAS

[75] Inventors: Shlomo Margalit, Pasadena; Amnon Yariv, San Marino; Zeev Rav-Noy, Los Angeles, all of Calif.

[73] Assignee: California Institute of Technology, Pasadena, Calif.

[21] Appl. No.: 617,495

[22] Filed: Jun. 5, 1984

[51] Int. Cl.$^4$ ............................................. H01L 29/78
[52] U.S. Cl. .................... 357/23.3; 357/23.4; 357/23.2; 357/15; 357/16; 357/55
[58] Field of Search .................. 357/23.3, 23.4, 23.2, 357/15, 16, 22, 55

[56] References Cited

U.S. PATENT DOCUMENTS 4,219,835  8/1980  van Loon et al. .................. 357/53
4,466,008  8/1984  Beneking ............................. 357/22

FOREIGN PATENT DOCUMENTS 53-118987  10/1978  Japan ............................. 357/22 E
55-133574  10/1980  Japan ............................. 357/23.4

OTHER PUBLICATIONS

Mok, et al., A V-Groove Schottky-Barrier FET for UHF Applications, IEEE Trans. Electron Devices, vol. ED-25, No. 10, Oct. 1978, pp. 1235-1240.
Salama, et al., Nonplanar Power Field-Effect Transistors, IEEE Trans. Electron Devices, vol. ED-25, No. 10, Oct. 1978, pp. 1222-1228.
Lisiak, et al., Optimization of Nonplanar Power MOS Transistors, IEEE Trans. Electron Devices, vol. ED-25, No. 10, Oct. 1978, pp. 1229-1234.
Tamer, et al., Numerical Comparison of DMOS, VMOS, and UMOS Power Transistors, IEEE Trans. Electron Devices, vol. ED-30, No. 1, Jan. 1983, pp. 73-76.

*Primary Examiner*—Martin H. Edlow
*Attorney, Agent, or Firm*—Freilich, Hornbaker, Rosen & Fernandez

[57] ABSTRACT

High transconductance vertical FETs are produced in III-V epitaxially grown layers doped n, p and n, with the in-between submicron (0.15 μm) layer serving as the FET channel. The layer on the drain side of the channel may be thicker (3 μm) than on the source side (1.5 μm). The structure is V-grooved to expose a nearly vertical surface that is Si implanted or regrown with graded n-type GaAs/GaAlAs before a gate contact is deposited on the vertical structure. An alternative to employ a heterostructure with GaAlAs layers for the source and drain, and GaAs for the channel layer. Graded GaAs/GaAlAs is then selectively regrown in the channel layer.

10 Claims, 6 Drawing Figures

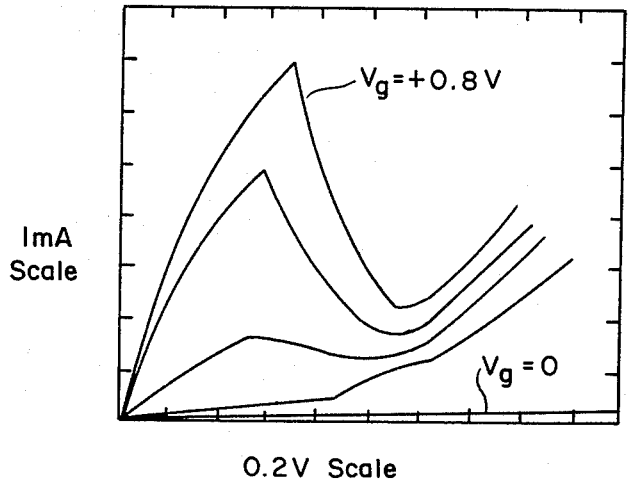

VERTICAL SCHOTTKY BARRIER GATE FIELD-EFFECT TRANSISTOR IN GAAS/GAALAS

ORIGIN OF THE INVENTION

The invention described herein was made in the performance of work supported by the Office of Navel Research and the National Science Foundation.

BACKGROUND OF THE INVENTION

This invention relates to vertical V-groove FETs, and more particularly to a Schottky barrier gate in a vertical FET structure that makes possible extremely short (less than 1000 Å) channel devices which are beyond the reach of optical lithographic processes.

The introduction of DMOS (double-diffused MOS) and VMOS (nonplanar or V-groove MOS) based on silicon and $SiO_2$ insulation has led to a significant improvement in the performance of microwave amplifiers, high speed logic devices, and especially high voltage switching devices. See Salama, et al., "Nonplanar Power Field-Effect Transistors," IEEE Trans. Elect. Dev., Ed-25, pp 1222-28 (1978), in which V-groove structures for field-effect transistors (FET's) of both the junction type (VFET) and the insulated gate type (LVMOST) for power applications, but only in silicon material systems. GaAs is suggested as an alternative material, but no structure using GaAs is described. Instead, it is implied that this material be used in a manner strictly analogous to the silicon material. See also Lesiak, et al., "Optimization of Nonplanar Power MOS Transistors," IEEE Trans. on Elect. Dev., Ed-25, pp 1229-34 (1978), Mok, et al., "A V-Groove Schottky-Barrier FET for UHF Applications," IEEE Trans. on Elect. Dev., Ed-25, pp 1235-40 (1978), and Tamer, et al., "Numerical Comparison of DMOS, VMOS and UMOS Power Transistors," IEEE Trans. Elect. Dev., Ed-30 pp 73-76 (1983).

In the past few years, short channel FET devices have generated considerable interest. Basically, in nonplanar V-groove structures, grooves are etched in a p-type silicon interlayer to define the channel region of the vertical structure between the silicon substrate depletion region (drain) and an n doped layer (source) on top. An MOS gate is then formed in the V-groove, as shown in FIG. 8 at page 126 by Salama, et al., supra. The problem with this prior art device is the long controlled channel that is necessary between the source and drain. However, conventional submicron devices often suffer from high source resistance which offsets the advantage gained from the short channel.

SUMMARY OF THE INVENTION

In the present invention, the critical channel-length dimension is defined by the thickness of a channel an epitaxially grown between source and drain layers in a III-V nonplanar vertical FET having means for providing a Schottky barrier gate in the in-between channel layer. The in-between channel layer can thus be controlled to a degree of accuracy unattainable in lithographic processes, especially with advanced crystal growth techniques such as MBE (molecular beam epitaxy) and MOCVD (metal-organic chemical vapor deposition). An advantage of this vertical FET structure is not only the ability to independently optimize the doping densities of the layers, but the ability to exploit transient electron transport phenomena through the use of heterojunctions, such as velocity overshoot and ballistic transport to achieve high electron velocity. Since this in-between channel layer can be epitaxially grown to a controlled submicron thickness, typically 0.15 μm, high transconductance is achieved.

In one embodiment, n, p and n epitaxial layers are grown by liquid phase epitaxy (LPE) or molecular beam epitaxy (MBE) on an n+GaAs substrate. The grooves are etched through the p GaAs channel in-between channel layer and into the n layer grown on the substrate to expose a section through the channel layer. Silicon is implanted ($6 \times 10^{12}$ $cm^{-2}$) on the exposed vertical surface to provide the depletion layer of a Schottky barrier gate in the channer layer. A contact for the gate is then deposited over the gate region. Modulation of the depletion region in the in-between channel layer with a signal applied on the gate contact will control conduction between the source and drain contacts.

In a second embodiment, a thin layer of n graded GaAs/GaAlAs is grown on the exposed vertical surface. This provides a higher Schottky barrier between the gate and the source to prevent possible source-drain punch through that may be experienced with the Si implanted surface if precautions are not taken, such as making the doping level in the preimplanted p—GaAs channel layer high.

Another embodiment employs n $Ga_{1-x}Al_xAs$ layers on each side of the n GaAs in-between channel layer for the source and drain. Graded GaAlAs can then be regrown on the vertical surface over just the in-between p GaAs layer by using LPE, as there exists preferential regrowth over the GaAs surface when both the GaAs and $Ga_{1-x}Al_xAs$ layers are exposed to a solution of GaAlAs. Very thin graded GaAlAs channels in the in-between layer can be controllably grown in this manner before a metal contact is deposited on the vertical surface.

In each embodiment, the composition of the source layer may be different from the drain layer, and may be optimized for breakdown characteristics. This optimization in one dimension is not possible for the silicon system of the prior art V-groove depletion MOSFET. Common to all of these III-V semiconductor devices is an in-between p channel layer epitaxially grown to a controlled submicron thickness between source and drain layers, and a Schottky barrier gate. III-V semiconductor devices offer superior performance due to the high mobility and saturation velocity.

The novel features of the invention are set forth with particularity in the appended claims. The invention will best be understood from the following description when read in connection with the accompanying drawings.

DESCRIPTION OF PREFERRED EMBODIMENTS

Figure 1:
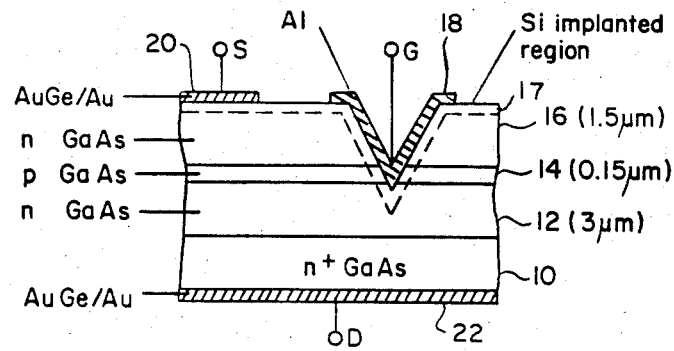
FIG. 1 is a schematic diagram of the first embodiment of the invention, namely an implanted vertical GaAs MESFET on which the gate is deposited.

The vertical FET design of this inventoin shown in FIG. 1 makes it possible to embed a thick n(2 to $4 \cdot 10^{17}$ cm$^{-3}$) layer next to the channel on both sides. The structure is comprised of an n+GaAs substrate 10, an n GaAs drain layer 12, a p GaAs channel layer 14 and an n GaAs source layer 16. The structure is etched to expose a near vertical surface across the in-between channel layer 14 so that a region 17 across the channel layer may be Si implanted. The FET channnal (i.e., the layer 14 at the vertical surface that has been Si implanted) is then deposited with aluminum to form a Schottky barrier gate contact 18. A source contact 20 and a drain contact 22 are deposited using a graded AuGe/Au deposition for good ohmic contact.

The source and drain parasitic series resistance can be drastically reduced owing to the removal of the undesirable effect of surface depletion in the channel between the gate edge and the source ohmic contact. However, the reduction of the channel length causes short channel effects to become more significant. These include a higher current in the subthreshold region and a threshold voltage which depends on the drain voltage.

The vertical Schottky barrier gate FET shown in FIG. 1 has considerable advantage compared to silicon vertical MOSFETs as far as high voltage switching applications are concerned. The dominant feature of high power FET designs is the minimization of the on resistance subject to the voltage, current, and speed requirements. A lightly doped n— layer may be used on the drain side of the channel layer to increase the drain breakdown voltage. At low drain voltgage, the resistance of the n— layer dominates the on characteristics of the device. There is a tradeoff between breakdown voltage and the on resistance. The on resistance of such devices increases with increasing drain source voltage capability. III–V vertical FET structure provides an on resistance value about six times smaller than Si devices with the same voltage capability because of the high electron mobility.

Vertical FETs structures as shown in FIG. 1 were fabricated with both LPE and MBE grown wafers. The epitaxial layers 12, 14 and 16 were grown by LPE or MBE on the n+GaAs substrate 10 with the following respective compositions: 3 $\mu$m n($1.5 \times 10^{17}$cm$^{-3}$), 0.15 $\mu$m p(1 to $2 \times 10^{17}$cm$^{-3}$), 1.5 $\mu$m n($3 \times 10^{17}$cm$^{-3}$). Grooves of 2.5 $\mu$m depth were etched. The region 17 was ion implanted $6 \times 10^{-12}$cm$^{-2}$ at an energy of 120 keV.

Schottky gates with reasonable breakdown voltages ($\sim$4V) and reasonably low series resistance ($\sim$1$\Omega$/mm) were obtained. Following annealing, AuGe/Au was deposited for the source contact 20 and drain contact 22. Deposition of the aluminum gate contact 18 completed the device.

Figure 2A:
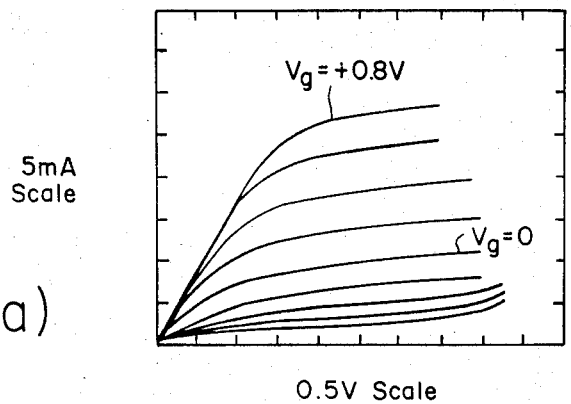
FIG. 2a illustrates the drain current-voltage characteristics of the ion-implanted vertical GaAs MESFET of FIG. 1 for an LPE grown layer, and an in-between p— layer of 100 μm defining the submicrons gate width.
Figure 2B:
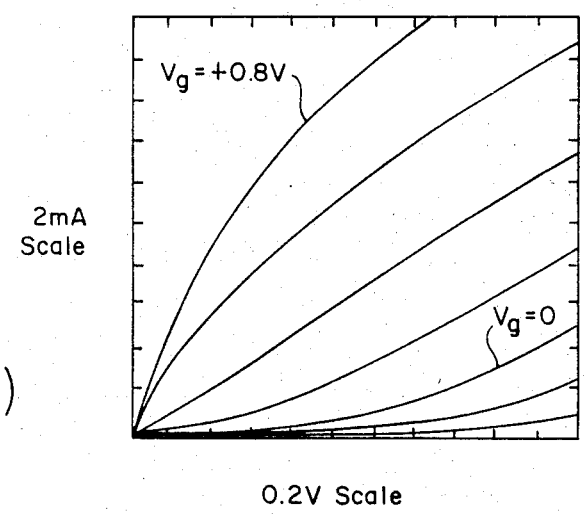
FIG. 2b illustrates the drain current-voltage characteristics of the ion-implanted vertical GaAs MESFET of FIG. 1 for an MBE grown layer and an in-between p— layer of 120 μm defining the submicron gate width.

Interesting results were obtained with the device shown in FIG. 1. When operating with the source and drain as shown, the d-c drain current-voltage (I-V) characteristics were as shown in FIG. 2a and 2b for the LPE grown structure (gate width of 100 $\mu$m) and the MBE grown structure (gate width of 120 $\mu$m), respectively. It should be noted that no hysteresis has been observed in FIG. 2b for MBE grown FETs in marked contrast to the LPE grown FETs observed in FIG. 2a for an GaAs MESFET on semi-insulating substrate. This is believed to be the result of reduced traps and defects in the MEB grown wafers. At zero gate voltage, the channel is fully depleted and the device is an enchancement type transistor.

FIGS. 2a and 2b show the short channel characteristics with the combined saturation and punch-through effects. When punch through occurs in the channel, electrons can be injecrted into the depleted channel region and the current is spaced charge limited. Upon low gate voltages, the space charge current dominates. However, at higher voltages, the total drain current is the sum of the channel and space charge limited current. These give rise to the characteristics shown in FIGS. 2a and 2b. A typical transconductance value, $g_m$, is about 250 mS/mm, and the highest obtained is 280 mS/mm. these values are "as measured" values. A conservative correction for the source resistance yields values in excess of 320 mS/mm.

Figure 2C:
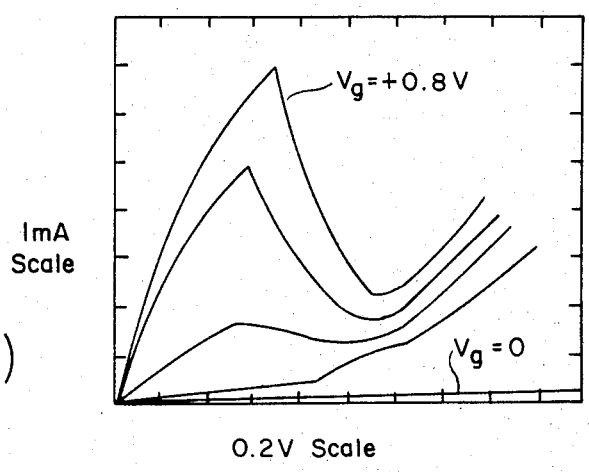
FIG. 2c illustrates the drain current-voltage characteristics of the device, the characteristics of which are shown in FIG. 2b, with the source and drain interchanged.

An interesting phenomenon is observed when the roles of the source and drain in the structure used in obtaining the I-V characteristics of FIG. 2b are interchanged. The transconductance $g_m$ is reduced due to the higher source resistance, as expected, but the device exhibits negative differential resistance (NDR) as shown in FIG. 2c. This is due, possibly, to the existence of a Gunn device in the n—source 16. It should be noted the the ratio between the peak and valley of the current is about three, which is larger than those observed in normal Gunn devices. This is due to the amplification of the NDR effect by the FET In other word, the effective $g_m$ of the transistor changes as the source resistance switches from the high to the low regime due to the Gunn effect. The onset of the NDR region occurs at lower voltage than in normal devices due to the geometrical crowding effect of the electrical field, resulting in higher effective field strength. Such characterisitics are ideal for a low device in an inverter.

Figure 3:
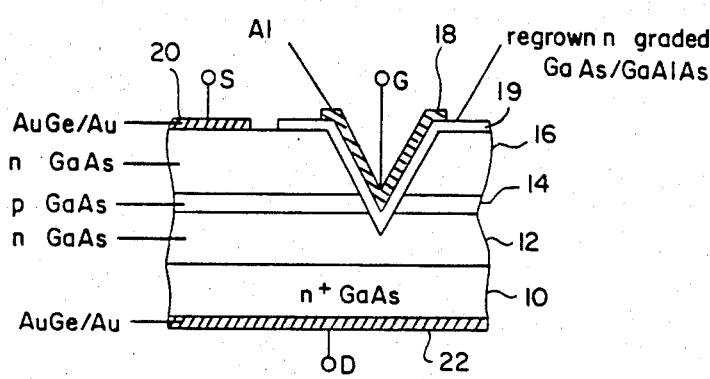
FIG. 3 is a schematic diagram of a second embodiment of the invention, namely a vertical GaAs MESFET with a thin graded GaAs layer (n-type) regrown on the vertical surface before depositing the gate.

In a short channel ion-implanted vertical FET, as shown in FIG. 1, there exists a practical and important limitation on the device perforamcne. To eliminate the undesirable source-drain punch-through effect, the doping level in the preimplanted p channel layer 17 has to be high. However, if the doping level is increased beyond $2 \times 10^{17}$cm$^{-3}$, control of the channel doping becomes difficult. Also, the implanted channel region will be a highly compensated region which leads to reduced mobility. In addition, too high an implantation dosage will degrade, or even destroy, the Schottky barrier between that part of the gate which overlaps the source and drain layers. These considerations lead to an upper limit of about $2 \times 10^{17}$cm$^{-3}$ for the implanted region 17. This problem can be solved by regrowing a thin graded GaAs/GaAlAs (n-type) layer 19, as shown in FIG. 3, instead of implanting Si as shown in FIG. 1. This completely removes the limitation on the p and n doping levels. As a result, the Schottky barrier between the gate 18 and the n-type GaAs source layer is now higher.

FIG. 3 illustrates a vertical FET similar to that of FIG. 1. Consequently, the same reference numerals are applied to the same component parts. The difference is that in place of an Si implanted region 17 forming a Schottky barrier gate, there is regrown a thin layer 19 of graded GaAlAs (n-type), or the equivalent two thin layers of (n-type) GaAs and GaAlAs regrown over the etched surface.

The drain current-voltage characteristics are similar to that of the substrate illustrated schematically in FIG. 1. In both embodiments, the depletion layer of the Schottky barrier modulates the channel layer, at its Si implanted region in the case of the embodiment of FIG. 1, and at its Schottky diode between the channel layer 14 and the regrown layer 19 in the case of the embodiment of FIG. 3. The use of a vertical structure allows submicron channels to be fabricated without sophisticated photolithographic processes. Since the transistors exhibit high transconductance, potential applications include high power, high voltage, switching devices.

Figure 4:
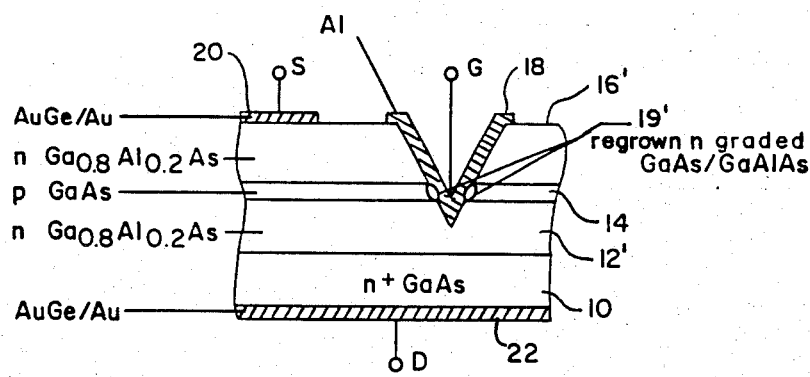
FIG. 4 is a schematic diagram of a third embodiment of the invention, namely a vertical heterostructure with preferential lateral growth of a thin graded GaAlAs (n-type) channel regrown in an in-between layer of GaAs.

High speed devices may utilize the heterostructure of FIG. 4 in which $Ga_{1-x}Al_xAs$ layers 16' and 12' for the source and drain replace the GaAs layers 16 and 12, respectively, of the structure in FIG. 3. Then n-type graded GaAs/GaAlAs 19' can be regrown on the p-type GaAs channel layer by lateral selective area growth using LPE due to the preferential growth over only the p-type GaAs surface when both the GaAs and $Ga_{1-x}Al_xAs$ regions of the near vertical surface are exposed to a solution of GaAlAs. Very thin layers can be controllably grown in this manner. An additional advantage of this structure shown in FIG. 4 is the increased Schottky barrier height between the gate contact metal and the higher gap GaAlAs. Preliminary results from devices yielded an uncorrected $g_m$ values as high as 280 m S/mm. Use of III-V material thus offers an extra degree of freedom not available in Si devices through the use of heterojunctions. The band discontinuity at a heterojunction can be used to exploit transient electron transport phenomena, such as velocity overshoot and ballistic transport, to achieve high electron velocity. Moreover, the difference in mobility and bandgaps of III-V compounds can be utilized to optimize important parameters, such as breakdown voltage, in different applications.

Although particular embodiments of the invention have been described and illustrated herein, it is recognized that modifications and variations may readily occur to those skilled in the art. For example, although aluminum has been used to form the Schottky barrier gate in each example, other materials (metals, semiconductors or compounds of metals and semiconductors) could be used. Consequently, it is intended that the claims be interpreted to cover such modifications and variations.

What is claimed is:

1. A vertical field-effect transistor comprised of epitaxial layers of III-V semiconductor material including a drain layer grown more than one micron thick, a channel layer, and a source layer grown more than one micron thick, with said channel layer grown between said source and drain layers to a controlled submicron thickness for high transconductance of the transistor, and have exposed a cross sectional surface through said channel layer, and further including source and drain contacts for respective one of said source and drain layers, and means for providing a depletion layer of a Schottky barrier gate on the exposed cross sectional surface of said submicron channel layer.

2. A vertical field-effect transistor as defined in claim 1 wherein said source and drain layers are n-type GaAs layers, and said channel layer is p-type GaAs.

3. A vertical field-effect transistor as defined in claim 1 wherein said three epitaxial layers are grown on a GaAs substrate with a GaAs channel layer between said source and drain layers, and said means is comprised of silicon implanted in said channel layer through said exposed vertical surface to provide the depletion layer of a Schottky barrier gate on the channel layer, whereby modulation of the depletion region in the channel layer with a signal applied on said gate will control conduction between said source and drain contacts.

4. A vertical field-effect transistor as defined in claim 1 wherein said three epitaxial layers are grown on n+GaAs substrate with a p-type GaAs channel layer in between n-type GaAs source and drain layers, and said means is comprised of graded n-type GaAs/GaAlAs regrown on said exposed cross sectional surface to provide the depletion layer of a Schottky barrier gate on the p-type channel layer.

5. A vertical field-effect transistor as defined in claim 1 wherein said three epitaxial layers are grown on n+ GaAs substrate with a p-type GaAs channel layer in between n-type $Ga_{1-x}Al_xAs$ source and drain layers, and said means is comprised of n-type graded GaAs/GaAlAs preferentially regrown on the exposed cross sectional surface of said p-type channel layer to provide the depletion layer of a Schottky barrier gate on the p-type channel layer.

6. A vertical field-effect transistor as defined in claim 3 wherein said source and drain layers are n-type GaAs layers, and said channel layer is p-type GaAs.

7. A high transconductance vertical field-effect transistor comprising epitaxially grown layers of GaAs semiconductor material grown on a substrate of said material doped n+, a first thick layer of about 3 μm in thickness of said material n doped about $1.5\times10^{17} cm^{-3}$, a second thin layer about 0.15 μm in thickness of said material p doped from 1 to $2\times10^{17} cm^{-3}$, and a third layer about 1.5 μm in thickness of said material n doped about $3\times10^{17} cm^{-3}$, a groove of about 2.5 μm depth to expose in a cross sectional surface said second thin layer, source and drain contacts for respective ones of said third layer and substrate, and means for providing a depletion region of a Schottky barrier gate on said exposed cross sectional surface of said second, thin layer.

8. A vertical field-effect transistor as defined in claim 7 wherein said means is comprised of silicon implanted in said thin, second layer through said exposed cross sectional surface to provide the depletion layer of a Schottky barrier gate, and a metal contact deposited over said implanted silicon.

9. A vertical field-effect transistor as defined in claim 7 wherein said means is comprised of graded n-type GaAs/GaAlAs grown over said exposed cross sectional surface to provide the depletion layer of a Schottky barrier gate, and a metal contact deposited over said graded GaAs/GaAlAs.

10. A high transconductance vertical field-effect transistor comprising epitaxially grown layers of GaAs and GaAlAs semiconductor materials grown on a substrate of said n+GaAs, a first thick layer about 3 μm in thickness of GaAlAs n doped about $1.5\times10^{17} cm^{-3}$, a second, thin layer about 0.15 μm in thickness of GaAs p doped from 1 to $2\times10^{17}$cm$^{-3}$, and a third layer about 1.5 μm in thickness of GaAlAs material in doped about $3\times10^{17}$cm$^{-3}$; a groove of about 2.5 μm depth to expose a cross sectional surface of said second layer, source and drain contacts for respective ones of said third layer and substrate, and means for providing a Schottky barrier gate in the exposed cross sectional surface of said second layer comprised of graded n-type GaAs/GaAlAs selectively regrown over the exposed cross sectional surface of said second layer in said groove and a metal contact deposited over said graded GaAs/GaAlAs selectively regrown.

* * * * *